United States Patent [19]
Takiguchi et al.

[11] Patent Number: 5,539,311
[45] Date of Patent: Jul. 23, 1996

[54] METHOD FOR REDUCING ARTIFACTS IN MAGNETIC RESONANCE IMAGING

[75] Inventors: Kenji Takiguchi, Kashiwa; Hiroyuki Itagaki, Kokubunji; Hidemi Shiono, Akigawa; Etsuji Yamamoto, Akishima, all of Japan

[73] Assignee: Hitachi Medical Corporation, Tokyo, Japan

[21] Appl. No.: 160,807

[22] Filed: Dec. 3, 1993

[30] Foreign Application Priority Data

Dec. 3, 1992 [JP] Japan .................................. 4-324008

[51] Int. Cl.⁶ .................................................. G01V 3/00
[52] U.S. Cl. ........................................... 324/309; 324/306
[58] Field of Search .................................. 324/306, 307, 324/309, 314, 318; 128/653.5

[56] References Cited

U.S. PATENT DOCUMENTS 5,151,656  9/1992  Maier et al. .............................. 324/307
5,184,073  2/1993  Takeuchi et al. ....................... 324/307
5,221,898  6/1993  Takiguchi et al. ..................... 324/309

FOREIGN PATENT DOCUMENTS 5245127  9/1993  Japan .

*Primary Examiner*—Louis M. Arana
*Attorney, Agent, or Firm*—Antonelli, Terry, Stout & Kraus

[57] ABSTRACT

In magnetic resonance imaging, a first echo train is obtained by applying a readout gradient magnetic field to a region of interest to be imaged and periodically inverting the polarity of the readout gradient magnetic field, without applying an encoding gradient magnetic field to the region of interest. A periodic change of phase shift of the first echo train is detected from the first echo train. Information indicating phase shifts of all of the echoes in the first echo train is obtained using the periodic change of phase shift. A second echo train is obtained by applying a readout gradient magnetic field and an encoding magnetic field to the region of interest and periodically inverting the polarity of the readout gradient magnetic field. Phases of echoes in the second echo train are corrected using the information indicating phase shifts of all of the echoes in the first echo train.

32 Claims, 6 Drawing Sheets

METHOD FOR REDUCING ARTIFACTS IN MAGNETIC RESONANCE IMAGING

BACKGROUND OF THE INVENTION

The present invention relates to a method for reducing artifacts in imaging using a magnetic resonance imaging apparatus (hereinafter abbreviated to an MRI apparatus), and more particularly relates to a method for reducing artifacts in ultra high-speed imaging involving generating echoes successively.

Conventionally, in a single echo measurement which is represented by the spin-warp method, the phase of an echo may be shifted under the influence of a phase shift caused by characteristics of the apparatus. However, the influence of the phase shift caused by characteristics of the apparatus on the echo is constant with respect to the amount of phase encoding, such that the phase shift of each echo becomes constant.

Therefore, when an image is to be displayed by absolute value, no phase correction is necessary.

In a multi-echo measurement which is represented by the echo-planar method, the influence of a phase shift caused by characteristics of the apparatus on an echo is not constant, and when echoes have different phase shifts, the influence of phase shift cannot be ignored because the phase difference between echoes may cause artifacts.

SUMMARY OF THE INVENTION

An object of the present invention is to provide a method for reducing artifacts in ultra high-speed imaging involving applying a readout gradient magnetic field by inverting the polarity of the readout gradient magnetic field after applying a radio frequency pulse, thus generating successive echoes.

The above object of the present invention is accomplished by the present invention which provides a method for reducing artifacts in magnetic resonance imaging including the steps of generating a first echo train by applying a readout gradient magnetic field in a first direction by inverting the polarity of the readout gradient magnetic field after selectively exciting a region of interest to be imaged; obtaining information indicating phase shifts of echoes from at least a part of the generated first echo train; generating a second echo train by applying the readout gradient magnetic field in the above first direction by inverting the polarity of the readout gradient magnetic field after selectively exciting the above region of interest to be imaged once again and by applying an encoding gradient magnetic field in a second direction perpendicular to the above first direction; and correcting the phase of at least one echo in the generated second echo train on the basis of the above information indicating the phase shifts of echoes.

According to the method for reducing artifacts of the present invention, in the ultra high-speed imaging involving applying a readout gradient magnetic field by inverting the polarity of the readout gradient magnetic field after applying a radio frequency pulse, thus generating successive echoes, a periodic change of phase shift of successive echoes is detected and a method for correcting the phases of the echoes using this periodic change of phase shift is realized.

Namely, without detecting phase shifts of all of the echoes, phases of echoes having a low signal level can be accurately corrected, and hence artifacts in an image can be reduced.

DETAILED DESCRIPTION OF THE PREFERRED EMBODIMENTS

Figure 1:
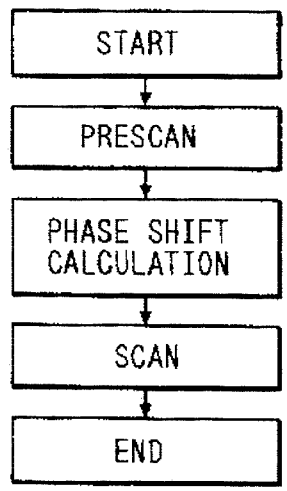
FIG. 1 is a flow chart showing the processes of the method for reducing artifacts of the present invention.

FIG. 1 shows the flow of processes of the method for reducing artifacts in MRI of the present invention. The flow consists of a prescan constituting a first process, a phase shift calculation constituting a second process, and a scan constituting a third process. Next, the operation of this embodiment will be explained on the basis of the flow.

Figure 2:
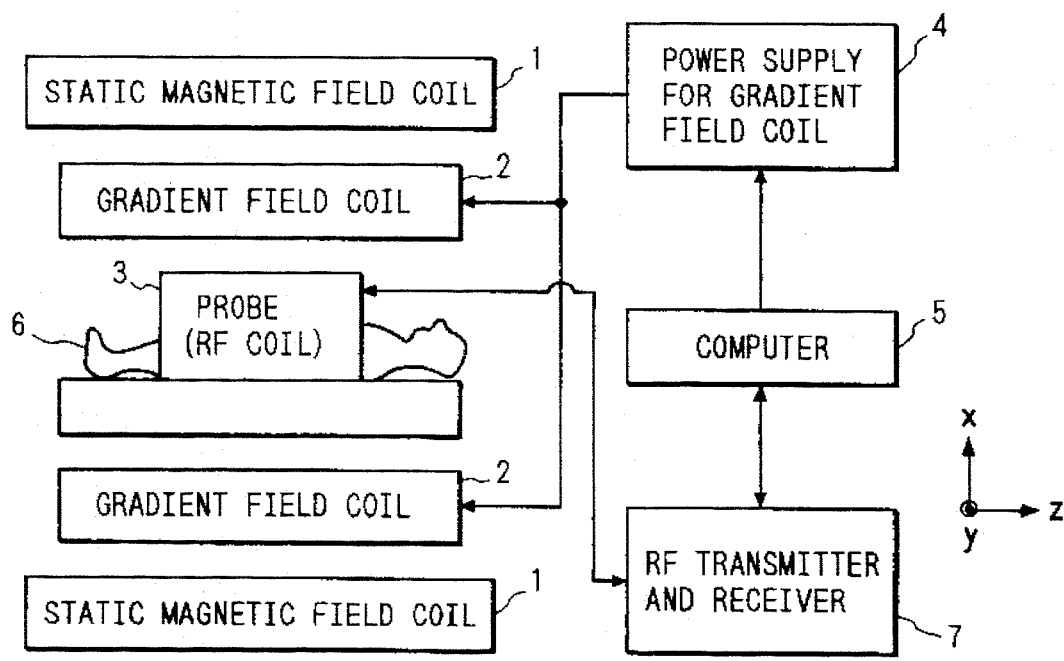
FIG. 2 is a block diagram showing an example of an MRI apparatus for executing the method for reducing artifacts of the present invention.

FIG. 2 is a block diagram showing the structure of an example of an MRI apparatus for executing the method for reducing artifacts of the present invention. This apparatus consists of a static magnetic field coil 1 for generating a static magnetic field, a gradient field coil 2 for generating gradient magnetic fields, a probe (RF coil) 3 for applying a radio frequency pulse to a human body 6 and for detecting an echo generated in the human body 6, a power supply 4 for the gradient field coil 2, and an RF (radio frequency) transmitter and receiver 7 for transmitting a radio frequency pulse to the probe (RF coil) 3 and for receiving an echo detected by the probe (RF coil) 3, and a computer 5. The gradient field coil 2 has three sets of coils for generating gradient magnetic fields for establishing magnetic field intensity gradients in three directions, such as the direction of the static magnetic field (the z direction) and two directions perpendicular to this direction (the x and y directions). These gradient magnetic fields are called Gx, Gy, and Gz. The gradient magnetic fields and transmission of a radio frequency pulse and reception of an echo are controlled according to a predetermined pulse sequence via the computer 5. In FIG. 2, the human body 6 lying in the z direction in a space formed by the probe (RF coil) 3 is an object to be inspected.

Figure 3:
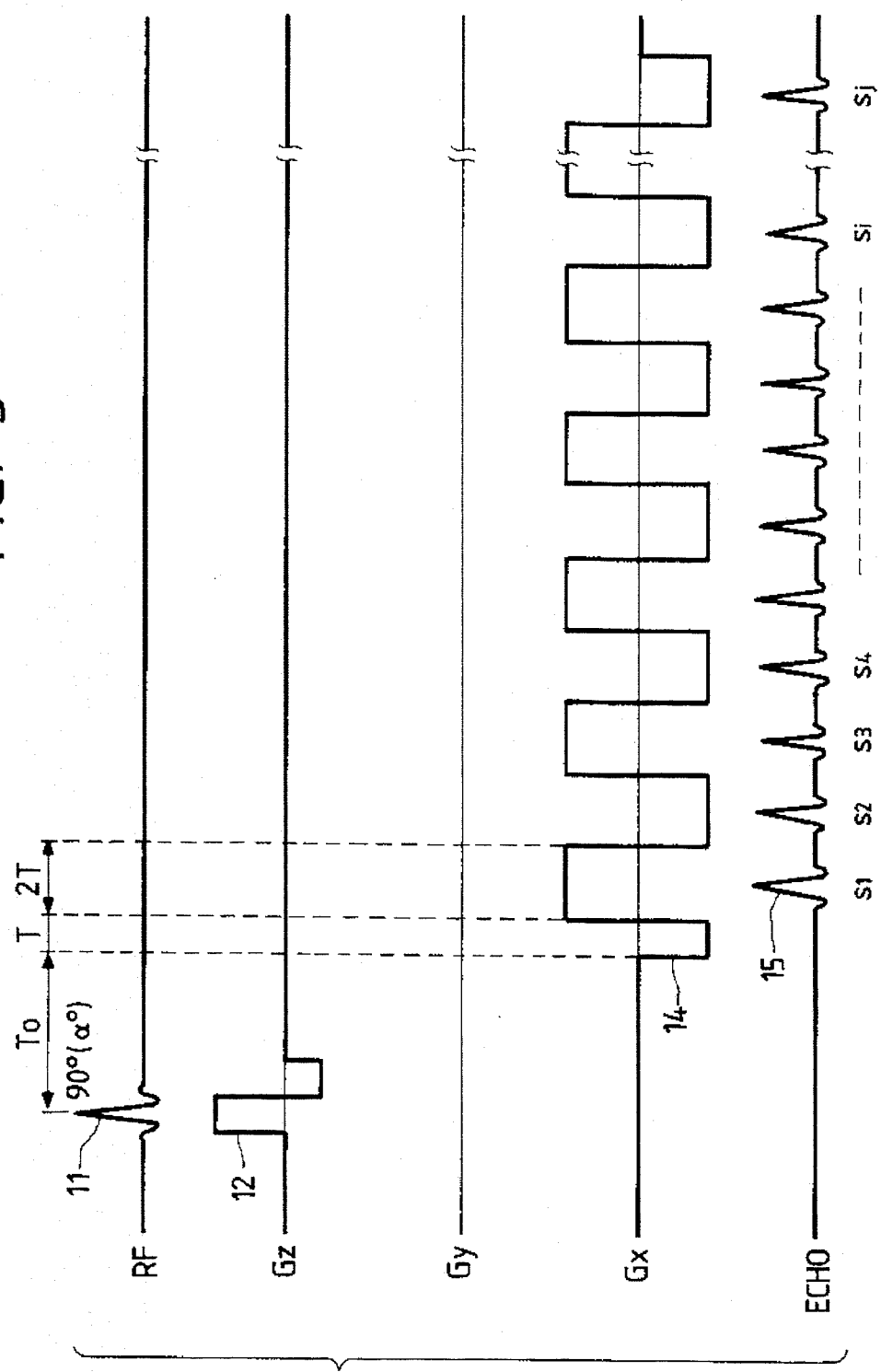
FIG. 3 is a timing chart showing a pulse sequence of the first example of the method for reducing artifacts of the present invention.

FIG. 3 shows a pulse sequence for explaining the prescan of the first process in the first embodiment of the present invention. First, a radio frequency pulse 11 and a gradient magnetic field Gz in the form of a pulse 12 for establishing a magnetic field intensity gradient in the z direction are applied to select a region of interest. When the radio frequency pulse and the gradient magnetic field are applied simultaneously, the region of interest can be selectively excited. The flip angle of the radio frequency pulse 11 is generally 90°. However, the radio frequency pulse may be a pulse with a flip angle of α° which is smaller than 90°. Next, at a time of T0 after the radio frequency pulse is applied, a gradient magnetic field Gx in the form of a pulse 14 for establishing a magnetic field intensity gradient in the x direction is applied for a time of T.

Thereafter, by inverting the polarity of the gradient magnetic field Gx, thus inverting the direction of the magnetic field intensity gradient in the x direction, at intervals of 2T, the application of the gradient magnetic field Gx is successively repeated. The gradient magnetic field Gx is called a readout gradient magnetic field. During this period, an echo 15 is generated whenever the integration of the gradient magnetic field Gx with time becomes zero, and the echoes are sampled sequentially and the sampled echoes are stored in a storing device within the computer 5. In an echo train consisting of j echoes in total, an echo which is generated first is designated as S1, an echo which is generated second as S2, - - - , an echo which is generated in the i-th place as Si, - - - , and an echo which is generated in the j-th place as Sj.

Figure 4:
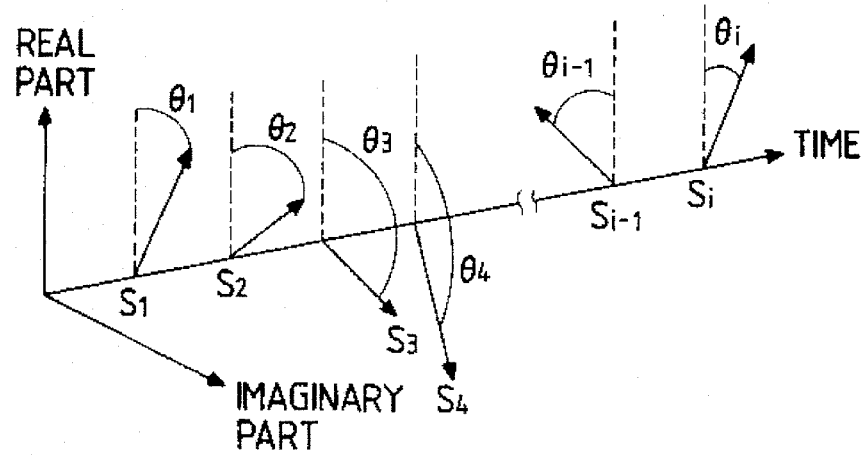
FIG. 4 is an illustration showing the rotation of phases of echoes in an echo train.

In the second process (phase shift calculation), the phase shifts of the echoes in the echo train are obtained. When there is no phase shift caused by characteristics of the apparatus, no phase difference is generated between each pair of neighboring echoes. However, since the phases of the echoes in the echo train are actually rotated by the phase shift caused by characteristics of the apparatus as shown in FIG. 4, a phase difference is generated between each pair of neighboring echoes and artifacts are caused. In the multi-echo measurement which is represented by the echo-planar method shown in FIG. 3, 32 to 128 echoes are usually acquired successively in response to one excitation. Therefore, it is necessary to detect the phase shift of each echo and correct its phase. In this case, a periodic change of phase shift of the echo train is detected. Therefore, by using this periodic change of phase shift, there is no need to detect the phase shifts of all of the echoes in the echo train.

Furthermore, since signal decay is caused by relaxation, a sufficient signal level cannot be ensured in the rear part of the echo train, and thus it is difficult to accurately detect the phase shifts of the echoes in the rear part of the echo train. When the periodic change of phase shift is detected from the echoes in the front part of the echo train where the signal level is high, there is no need to detect the phase shifts of the echoes in the rear part of the echo train where the signal level is low, and the periodic change of phase shift obtained from the first part of the echo train can be used. As shown in Formula (1), the phase shift of an echo is obtained from the real part and the imaginary part of the peak value of the echo.

Since the peak value of an echo is a value at a location where the encoding gradient magnetic field becomes substantially zero, the phase at this location can be considered to be a phase shift caused by characteristics of the apparatus. Designating the real part of an echo signal Si as Re[Si] and the imaginary part of Si as Im[Si], the phase θi is expressed as follows:

$$\theta i = \tan^{-1} \frac{Im[Si]}{Re[Si]} \quad (i = 1, 2 \ldots j) \tag{1}$$

Namely, the phase for maximizing the real part of the peak value of each echo is detected sequentially starting at the first echo of the sampled echo train. Or, by converting each echo to a projection signal by a Fourier transformation and detecting the phase for maximizing the area of the real part of each projection signal, the same phase shift can be obtained.

Assuming that the phase of the first echo becomes almost equal to the phase of the i-th echo, it can be considered that the phase of the i-th echo is rotated by 2π with respect to the phase of the first echo. Therefore, for the i-th and subsequent echoes, it can be assumed that θ(i)=θ(1), θ(i+1)=θ(2), - - - . Or, by detecting the phase difference between neighboring echoes, the periodic change of phase shift can be detected.

The above is an example in which the phase shifts of the echoes are detected sequentially from the first echo. However, by dividing the echoes into echoes of even numbers and echoes of odd numbers, that is, dividing the echoes into a group of echoes which are generated when the polarity of the readout gradient magnetic field is positive and a group of echoes which are generated when the polarity of the readout gradient magnetic field is negative, and detecting the phase shifts of the echoes in the two groups of echoes in the same way, a periodic change of phase shift can be detected separately from each of the two groups of echoes.

Figure 5:
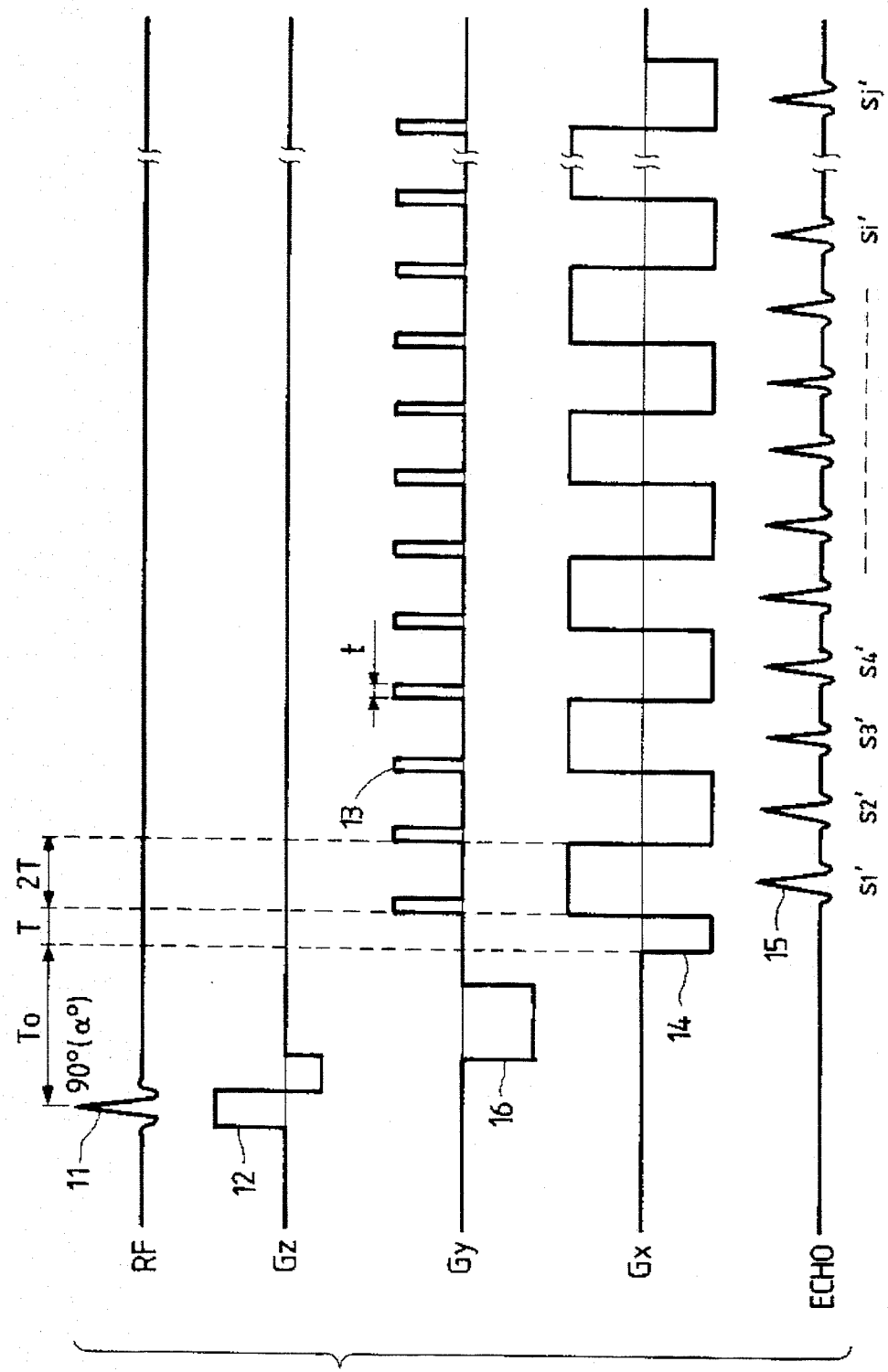
FIG. 5 is a timing chart showing a pulse sequence of the first example of the method for reducing artifacts of the present invention which follows the pulse sequence shown in FIG. 3.

In the third process (scan), the region of interest is scanned in the actual measurement mode shown in FIG. 5.

First, a radio frequency pulse 11 and a gradient magnetic field Gz in the form of a pulse 12 for establishing a magnetic field intensity gradient in the z direction are applied to select a region interest. The flip angle of the radio frequency pulse 11 is generally 90°. However, the radio frequency pulse may be a pulse with a flip angle of α° which is smaller than 90°. Next, at a time of T0 after the radio frequency pulse is applied, a gradient magnetic field Gx in the form of a pulse 12 for establishing a magnetic field intensity gradient in the x direction is applied for a time of T. Thereafter, by inverting the polarity of the gradient magnetic field Gx, thus inverting the direction of the magnetic field intensity gradient in the x direction, at intervals of 2T, the application of the gradient magnetic field Gx is successively repeated. At a time of T0+T, a gradient magnetic field Gy in the form of a pulse 13 for establishing a magnetic field intensity gradient in the y direction is applied for a time of t which is shorter than the time T.

Thereafter, the application of the gradient magnetic field Gy is repeated at the same polarity for a time of t at intervals of 2T. The gradient magnetic field Gy is called an encoding gradient magnetic field because it has a function of providing position information in the y direction to the phase of an echo. During this period, an echo 15 is generated whenever the integration of the gradient magnetic field Gx with time becomes zero, and the echoes are sampled sequentially and the sampled echoes are stored in a storing device within the computer 5.

In an echo train consisting of j echoes in total, the echoes are designated as S1', S2', - - - , Si', - - - , and Sj'.

For this echo train, the phases of the echoes are corrected as shown in Formula (2) using the phase shifts which were obtained previously, that is, the amounts of phase correction. The corrected echoes are designated as Si'', S2'', - - - , Si'', - - - , and Sj''. When an image is reconstructed by transforming the corrected echoes by a Fourier transformation, an image in which artifacts are reduced can be obtained.

$$Si''=Si' \exp(-j \cdot \theta i) \quad (i=1, 2 \ldots j) \tag{2}$$

The half encoding has been used to describe the above embodiment. However, it is obvious that the present invention is also valid for the full encoding method. When a pulse 16 of the gradient magnetic field Gy having an area which is equal to half of the total area of the pulses 13 and a polarity which is opposite to the polarity of the pulses 13 is applied within the period T0, the full encoding method can be used for imaging.

Figure 6:
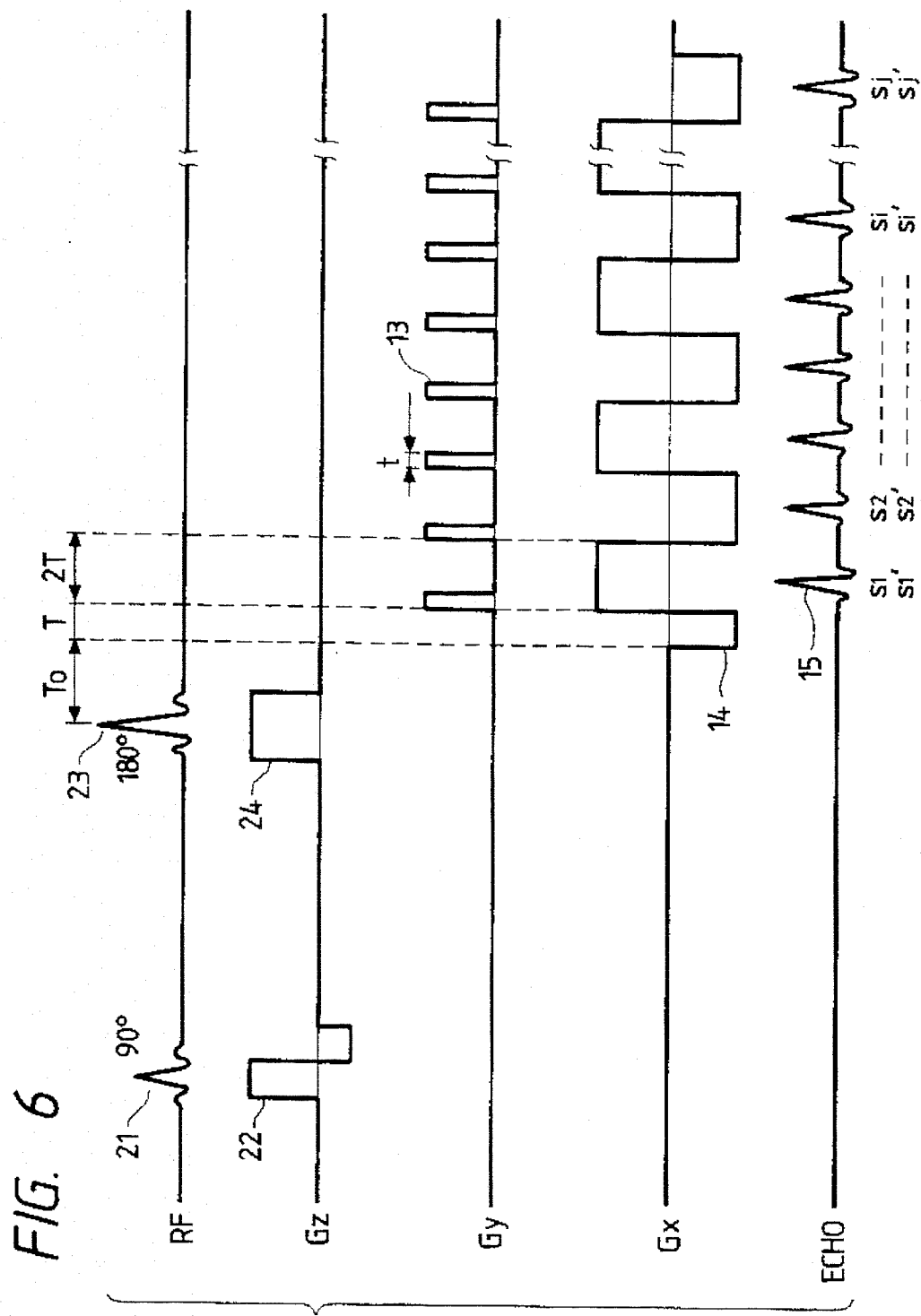
FIG. 6 is a timing chart showing a pulse sequence of the second example of the method for reducing artifacts of the present invention.

A pulse sequence of the second embodiment is shown in FIG. 6. In the first process, first a radio frequency pulse 21 (flip angle=90°) and a gradient magnetic field Gz in the form of a pulse 22 for establishing a magnetic field intensity gradient in the z direction are applied to select a region of interest. Furthermore, an inversion radio frequency pulse 23 (flip angle=180°) and a gradient magnetic field Gz in the form of a pulse 24 are applied to invert the polarity of magnetization in the selected region. Next, at a time of T0 after the inversion radio frequency pulse is applied, a gradient magnetic field Gx in the form of a pulse 14 for establishing a magnetic field intensity gradient in the x direction is applied for a time of T.

Thereafter, by inverting the polarity of the gradient magnetic field Gx, thus inverting the direction of the magnetic field intensity gradient in the x direction, at intervals of 2T, the application of the gradient magnetic field Gx is successively repeated. During this period, an echo 15 is generated whenever the integration of the gradient magnetic field Gx with time becomes zero, and the echoes are sampled sequentially and the sampled echoes are stored in a storing device within the computer 5. In an echo train consisting of j echoes in total, an echo which is generated first is designated as S1, an echo which is generated second as S2, - - - , an echo which is generated in the i-th place as Si, - - - , and an echo which is generated in the j-th place as Sj.

The second process is the same as that of the first embodiment, and the phase shifts of the echoes in the echo train, that is, the amounts of phase correction, are obtained.

In the third process, first a radio frequency pulse 21 and a gradient magnetic field Gz in the form of a pulse 22 for establishing a magnetic field intensity gradient in the z direction are applied to select a region of interest.

Furthermore, an inversion radio frequency pulse 23 and a gradient magnetic field Gz in the form of a pulse 24 are applied to invert the polarity of magnetization in the selected region.

Next, at a time of T0 after the inversion radio frequency pulse is applied, a gradient magnetic field Gx in the form of a pulse 14 for establishing a magnetic field intensity gradient in the x direction is applied for a time of T. Thereafter, by inverting the polarity of the gradient magnetic field Gx, thus inverting the direction of the magnetic field intensity gradient in the x direction, at intervals of 2T, the application of the gradient magnetic field Gx is successively repeated. At a time of T0+T, a gradient magnetic field Gy in the form of a pulse 13 for establishing a magnetic field intensity gradient in the y direction is applied for a time of t which is shorter than the time T. Thereafter, the application of the gradient magnetic field Gy is repeated at the same polarity for a time of t at intervals of 2T.

During this period, an echo 15 is generated whenever the integration of the gradient magnetic field Gx with time becomes zero, and the echoes are sampled sequentially and the samples echoes are stored in a storing device within the computer 5. In an echo train consisting of j echoes in total, the echoes are designated as S1', S2', - - - , Si', - - - , and Sj'. For this echo train, the phases of the echoes are corrected as shown in Formula (2) above using the amounts of phase correction which were obtained previously. The corrected echoes are designated as Si", S2", - - - , Si", - - - , and Sj".

When an image is reconstructed by transforming the corrected echoes by a Fourier transformation, an image in which artifacts are reduced can be obtained.

Figure 7:
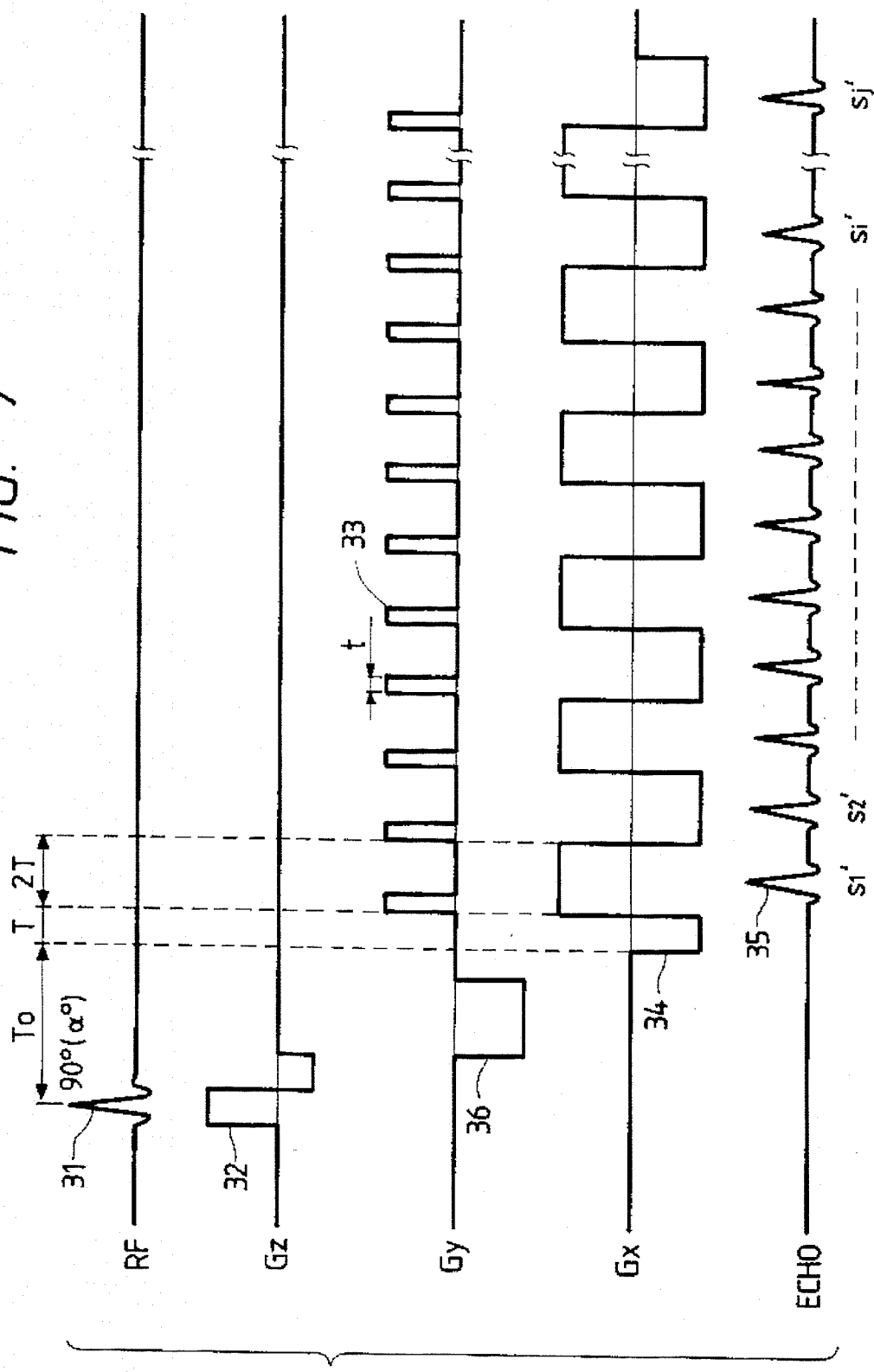
FIG. 7 is a timing chart showing a pulse sequence of the third example of the method for reducing artifacts of the present invention.

A pulse sequence of the third embodiment is shown in FIG. 7.

Figure 8:
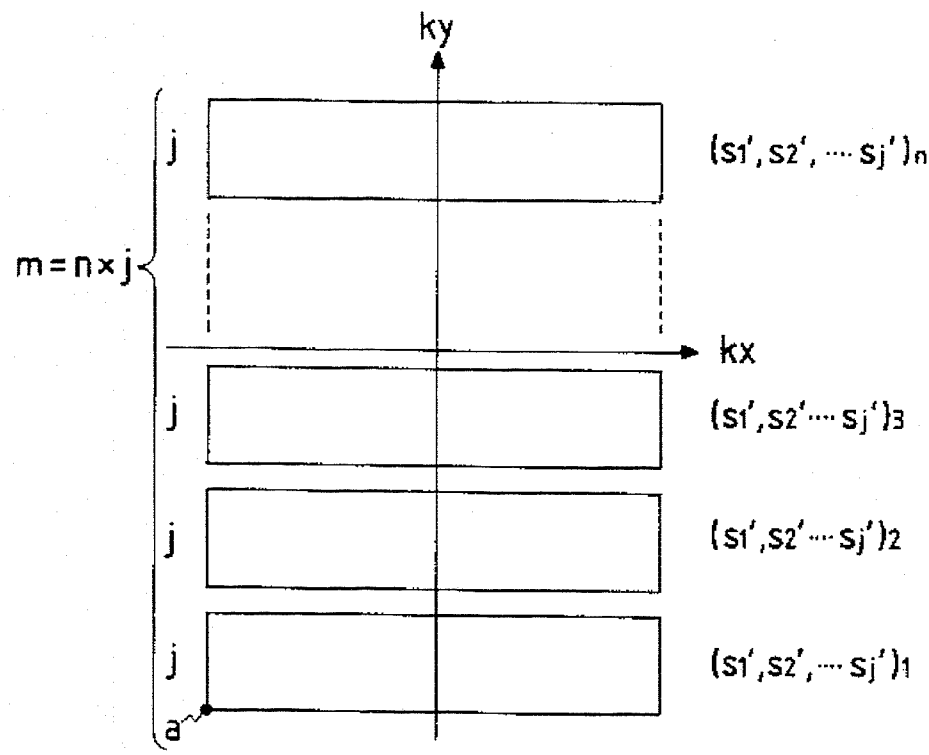
FIG. 8 is an illustration showing splitting a frequency space into n parts which is used in the third example of the method for reducing artifacts of the present invention.

In this sequence, a frequency space is split into n parts for measurement as shown in FIG. 8. It is assumed that m=n×j. Namely, assuming that the number of echoes necessary to reconstruct an image is m, j echoes are measured n times.

The first process and the second process are the same as those in the first embodiment. In the third process, the region of interest is scanned using the pulse sequence shown in FIG. 7. First, a radio frequency pulse 31 and a gradient magnetic field Gz in the form of a pulse 32 for establishing a magnetic field intensity gradient in the z direction are applied to select a region of interest. The flip angle of the radio frequency pulse 31 is generally 90°. However, the radio frequency pulse may be a pulse with a flip angle of α° which is smaller than 90°. Next, at a time of T0 after the radio frequency pulse is applied, a gradient magnetic field Gx in the form of a pulse 34 for establishing a magnetic field intensity gradient in the x direction is applied for a time of T. Thereafter, by inverting the polarity of the gradient magnetic field Gx, thus inverting the direction of the magnetic field intensity gradient in the x direction, at intervals of 2T, the application of the gradient magnetic field Gx is successively repeated. At a time of T0+T, a gradient magnetic field Gy in the form of a pulse 33 for establishing a magnetic field intensity gradient in the y direction is applied for a time of t which is shorter than the time T.

Furthermore, a pulse 36 of the gradient magnetic field Gy having an area which is equal to m/2 of the total area of j pulses 33 and a polarity which is opposite to the polarity of the j pulses 33 is applied within the period T0. Namely, the measurement starts at the location a in FIG. 8. Thereafter, the application of the gradient magnetic field Gy is repeated at the same polarity for a time of t at intervals of 2T. During this period, an echo 35 is generated whenever the integration of the gradient magnetic field Gx with time becomes zero, and the echoes are sampled sequentially and the sampled echoes are stored in a storing device within the computer 5. In an echo train consisting of j echoes in total, the echoes are designated as Si', S2', - - - , Si', - - - , and Sj'. For this echo train, the phases of the echoes are corrected as shown in Formula (2) above using the amounts of phase correction which were obtained previously. Then, the amplitude of the pulse 36 of the gradient magnetic field Gy is increased by an amount which increases the area of the pulse 36 by an amount equal to the total area of the j pulses 33, and the region of interest is again scanned using the pulse sequence shown in FIG. 7 as described above to obtain another echo train. This process is repeated until n echo trains have been obtained. The phases of the echoes in each of the additional echo trains are corrected using the aforementioned amounts of phase correction. When an image is reconstructed by transforming the corrected echoes of the n echo trains by a Fourier transformation, an image in which artifacts are reduced can be obtained. The manner in which the frequency space is split is not limited to the one described in this embodiment. Various modifications such as interleaving are possible.

According to the present invention, in ultra high-speed imaging involving applying a readout gradient magnetic field by inverting the polarity of the gradient magnetic field after applying a radio frequency pulse, thus generating successive echoes, phase shifts between neighboring echoes due to a phase shift caused by characteristics of the apparatus are calculated using a periodic change of phase shift, so that the phase shifts of echoes having low signal levels can be accurately corrected and an image free of artifacts can be obtained.

What is claimed is:

1. A method for reducing artifacts in magnetic resonance imaging comprising the steps of:

generating a first echo train by applying a readout gradient magnetic field in a first direction by inverting a polarity of the readout gradient magnetic field after selectively exciting a region of interest to be imaged;

obtaining information indicating phase shifts of echoes from at least a part of the generated first echo train;

generating a second echo train by applying the readout gradient magnetic field in said first direction by inverting the polarity of the readout gradient magnetic field after selectively exciting said region of interest to be imaged once again and by applying an encoding gradient magnetic field in a second direction perpendicular to said first direction; and correcting a phase of at least one echo in the generated second echo train on the basis of said information indicating the phase shifts of echoes;

wherein a periodic change of phase shift of said first echo train is detected from a part of said first echo train and furthermore information indicating the phase shifts of all the echoes in said first echo train is obtained on the basis of the detected periodic change of phase shift.

2. A method according to claim 1, wherein after generating said first echo train, applying the readout gradient magnetic field in said first direction by inverting the polarity of the readout gradient magnetic field after selectively exciting said region of interest to be imaged once again and applying the encoding gradient magnetic field in said second direction are repeated a plurality of times so that a plurality of second echo trains are generated;

wherein the phase of at least one echo in each train of the generated plurality of second echo trains is corrected on the basis of said information indicating the phase shifts of echoes; and wherein an initial amplitude of said encoding gradient magnetic field is changed every repetition of said plurality of times.

3. A method according to claim 2, wherein after said region of interest to be imaged is selectively excited, an inversion radio frequency pulse is applied in said region of interest so that a polarity of magnetization in said region of interest is inverted, and then said readout gradient magnetic field is applied or said readout gradient magnetic field and said encoding gradient magnetic field are applied.

4. A method according to claim 1, wherein after said region of interest to be imaged is selectively excited, an inversion radio frequency pulse is applied in said region of interest so that a polarity of magnetization in said region of interest is inverted, and then said readout gradient magnetic field is applied or said readout gradient magnetic field and said encoding gradient magnetic field are applied.

5. A method according to claim 1, wherein the periodic change of phase shift of the first echo train is detected from a region of high signal level in the first echo train.

6. A method according to claim 1, wherein the periodic change of phase shift of the first echo train is detected from a phase difference between neighboring echoes in the first echo train.

7. A method according to claim 1, wherein the first echo train includes a first group of echoes generated when the polarity of the readout gradient magnetic field is positive, and a second group of echoes generated when the polarity of the readout gradient magnetic field is negative; and wherein the periodic change of phase shift of the first echo train is detected separately from the first group of echoes and the second group of echoes.

8. A method according to claim 1, wherein the first echo train includes a front part and a rear part; and wherein the periodic change of phase shift of the first echo train is detected from only the front part of the first echo train.

9. A method of magnetic resonance imaging comprising the steps of:

generating a first echo train by applying a readout gradient magnetic field in a first direction by inverting a polarity of the readout gradient magnetic field after selectively exciting a region of interest to be imaged;

obtaining information indicating phase shifts of echoes from at least a part of the generated first echo train;

generating a second echo train by applying the readout gradient magnetic field in said first direction by inverting the polarity of the readout gradient magnetic field after selectively exciting said region of interest to be imaged once again and by applying an encoding gradient magnetic field in a second direction perpendicular to said first direction;

correcting a phase of at least one echo in the generated second echo train on the basis of said information indicating the phase shifts of echoes; and reconstructing an image from the second echo train in which the phase of at least one echo is corrected;

wherein a periodic change of phase shift of said first echo train is detected from a part of said first echo train and furthermore information indicating the phase shifts of all the echoes in said first echo train is obtained on the basis of the detected periodic change of phase shift.

10. A method according to claim 9, wherein after generating said first echo train, applying the readout gradient magnetic field in said first direction by inverting the polarity of the readout gradient magnetic field after selectively exciting said region of interest to be imaged once again and applying the encoding gradient magnetic field in said second direction are repeated a plurality of times so that a plurality of second echo trains are generated;

wherein the phase of at least one echo in each train of the generated plurality of second echo trains is corrected on the basis of said information indicating the phase shifts of echoes;

wherein an image is reconstructed from the plurality of second echo trains in which the phase of at least one echo in each train is corrected; and wherein an initial amplitude of said encoding gradient magnetic field is changed every repetition of said plurality of times.

11. A method according to claim 10, wherein after said region of interest to be imaged is selectively excited, an inversion radio frequency pulse is applied in said region of interest so that a polarity of magnetization in said region of interest is inverted, and then said readout gradient magnetic field is applied or said readout gradient magnetic field and said encoding gradient magnetic field are applied.

12. A method according to claim 9, wherein after said region of interest to be imaged is selectively excited, an inversion radio frequency pulse is applied in said region of interest so that a polarity of magnetization in said region of interest is inverted, and then said readout gradient magnetic field is applied or said readout gradient magnetic field and said encoding gradient magnetic field are applied.

13. A method according to claim 9, wherein the periodic change of phase shift of the first echo train is detected from a region of high signal level in the first echo train.

14. A method according to claim 9, wherein the periodic change of phase shift of the first echo train is detected from a phase difference between neighboring echoes in the first echo train.

15. A method according to claim 9, wherein the first echo train includes a first group of echoes generated when the polarity of the readout gradient magnetic field is positive, and a second group of echoes generated when the polarity of the readout gradient magnetic field is negative; and wherein the periodic change of phase shift of the first echo train is detected separately from the first group of echoes and the second group of echoes.

16. A method according to claim 9, wherein the first echo train includes a front part and a rear part; and wherein the periodic change of phase shift of the first echo train is detected from only the front part of the first echo train.

17. A method for reducing artifacts in magnetic resonance imaging comprising the steps of:

selectively exciting a region of interest to be imaged a first time;

generating a first echo train including a plurality of echoes from the region of interest by applying to the region of interest a readout gradient magnetic field having an intensity gradient in a first direction and periodically inverting a polarity of the readout gradient magnetic field;

detecting a periodic change of phase shift of the first echo train from only a part of the first echo train;

obtaining information indicating phase shifts of all of the echoes in the first echo train using the periodic change of phase shift;

selectively exciting the region of interest a second time;

generating a second echo train including a plurality of echoes from the region of interest by applying to the region of interest a readout gradient magnetic field having an intensity gradient in the first direction and periodically inverting a polarity of the readout gradient magnetic field, and an encoding gradient magnetic field having an intensity gradient in a second direction perpendicular to the first direction; and correcting a phase of at least one of the echoes in the second echo train based on the information indicating phase shifts of all of the echoes in the first echo train.

18. A method according to claim 17, wherein the steps of selectively exciting the region of interest a second time, generating a second echo train, and correcting a phase of at least one of the echoes in the second echo train are repeated a plurality of times, thereby generating a plurality of second echo trains in each of which the phase of at least one of the echoes is corrected based on the information indicating phase shifts of all of the echoes in the first echo train; and wherein an initial amplitude of the encoding gradient magnetic field is changed before each repetition of the step of generating a second echo train.

19. A method according to claim 18, further comprising the steps of:

applying an inversion radio frequency pulse to the region of interest to invert a polarity of magnetization in the region of interest between the step of selectively exciting the region of interest a first time and the step of generating a first echo train; and applying an inversion radio frequency pulse to the region of interest to invert a polarity of magnetization in the region of interest between the step of selectively exciting the region of interest a second time and the step of generating least one second echo train each time the steps of selectively exciting the region of interest a second time and generating least one second echo train are performed.

20. A method according to claim 17, further comprising the steps of:

applying an inversion radio frequency pulse to the region of interest to invert a polarity of magnetization in the region of interest between the step of selectively exciting the region of interest a first time and the step of generating a first echo train; and applying an inversion radio frequency pulse to the region of interest to invert a polarity of magnetization in the region of interest between the step of selectively exciting the region of interest a second time and the step of generating a second echo train.

21. A method according to claim 17, wherein the first echo train includes a high signal level region in which echoes have relatively high signal levels, and a low signal level region in which echoes have relatively low signal levels; and wherein the periodic change of phase shift of the first echo train is detected from only the high signal level region of the first echo train.

22. A method according to claim 17, wherein the periodic change of phase shift is detected from a phase difference between neighboring echoes in only a part of the first echo train.

23. A method according to claim 17, wherein the first echo train includes a first group of echoes generated when the polarity of the readout gradient magnetic field is positive, and a second group of echoes generated when the polarity of the readout gradient magnetic field is negative; and wherein the periodic change of phase shift of the first echo train is detected separately from the first group of echoes and the second group of echoes.

24. A method according to claim 17, wherein the first echo train includes a front part and a rear part; and wherein the periodic change of phase shift of the first echo train is detected from only the front part of the first echo train.

25. A method of magnetic resonance imaging comprising the steps of:

selectively exciting a region of interest to be imaged a first time;

generating a first echo train including a plurality of echoes from the region of interest by applying to the region of interest a readout gradient magnetic field having an intensity gradient in a first direction and periodically inverting a polarity of the readout gradient magnetic field;

detecting a periodic change of phase shift of the first echo train from only a part of the first echo train;

obtaining information indicating phase shifts of all of the echoes in the first echo train using the periodic change of phase shift;

selectively exciting the region of interest a second time;

generating a second echo train including a plurality of echoes from the region of interest by applying to the region of interest a readout gradient magnetic field having an intensity gradient in the first direction and periodically inverting a polarity of the readout gradient magnetic field, and an encoding gradient magnetic field having an intensity gradient in a second direction perpendicular to the first direction;

correcting a phase of at least one of the echoes in the second echo train based on the information indicating phase shifts of all of the echoes in the first echo train; and reconstructing an image from the second echo train in which the phase of at least one of the echoes is corrected.

26. A method according to claim 25, wherein the steps of selectively exciting the region of interest a second time, generating a second echo train, and correcting a phase of at least one of the echoes in the second echo train are repeated a plurality of times, thereby generating a plurality of second echo trains in each of which the phase of at least one of the echoes is corrected based on the information indicating phase shifts of all of the echoes in the first echo train;

wherein an initial amplitude of the encoding gradient magnetic field is changed before each repetition of the step of generating a second echo train; and wherein the image is reconstructed from the plurality of second echo trains in which the phase of at least one of the echoes is corrected.

27. A method according to claim 26, further comprising the steps of:

applying an inversion radio frequency pulse to the region of interest to invert a polarity of magnetization in the region of interest between the step of selectively exciting the region of interest a first time and the step of generating a first echo train; and applying an inversion radio frequency pulse to the region of interest to invert a polarity of magnetization in the region of interest between the step of selectively exciting the region of interest a second time and the step of generating least one second echo train each time the steps of selectively exciting the region of interest a second time and generating least one second echo train are performed.

28. A method according to claim 25, further comprising the steps of:

applying an inversion radio frequency pulse to the region of interest to invert a polarity of magnetization in the region of interest between the step of selectively exciting the region of interest a first time and the step of generating a first echo train; and applying an inversion radio frequency pulse to the region of interest to invert a polarity of magnetization in the region of interest between the step of selectively exciting the region of interest a second time and the step of generating a second echo train.

29. A method according to claim 25, wherein the first echo train includes a high signal level region in which echoes have relatively high signal levels, and a low signal level region in which echoes have relatively low signal levels; and wherein the periodic change of phase shift of the first echo train is detected from only the high signal level region of the first echo train.

30. A method according to claim 25, wherein the periodic change of phase shift is detected from a phase difference between neighboring echoes in only a part of the first echo train.

31. A method according to claim 25, wherein the first echo train includes a first group of echoes generated when the polarity of the readout gradient magnetic field is positive, and a second group of echoes generated when the polarity of the readout gradient magnetic field is negative; and wherein the periodic change of phase shift of the first echo train is detected separately from the first group of echoes and the second group of echoes.

32. A method according to claim 25, wherein the first echo train includes a front part and a rear part; and wherein the periodic change of phase shift of the first echo train is detected from only the front part of the first echo train.

* * * * *